United States Patent [19]

Barry et al.

[11] 4,089,104

[45] May 16, 1978

[54] METHOD AND APPARATUS FOR PREASSEMBLING A PRINTED CIRCUIT BOARD CONNECTOR

[75] Inventors: Richard Francis Barry, Southington; Charles Angus Gourley, Bethel; Dennis George Kohanek, Southbury, all of Conn.

[73] Assignee: Litton Systems, Inc., Beverly Hills, Calif.

[21] Appl. No.: 793,300

[22] Filed: May 3, 1977

[51] Int. Cl.² .......................... H05K 3/32; B23P 19/02

[52] U.S. Cl. .......................................... 29/626; 29/739; 29/741

[58] Field of Search .................. 29/626, 739, 741, 759

[56] References Cited

U.S. PATENT DOCUMENTS

| | | | |
|---|---|---|---|
| 2,995,617 | 8/1961 | Maximoff et al. | 29/630 D X |
| 3,182,276 | 5/1965 | Ruehlemann | 29/630 D X |
| 3,530,422 | 9/1970 | Goodman | 29/626 X |
| 3,564,691 | 2/1971 | Ackerman | 29/741 X |
| 3,676,926 | 7/1972 | Kendall | 29/739 X |
| 3,780,415 | 12/1973 | Ragard | 29/741 X |
| 3,800,416 | 4/1974 | Shultz, Jr. | 29/739 X |
| 3,896,533 | 7/1975 | Ullman | 29/741 X |

*Primary Examiner*—Victor A. DiPalma
*Attorney, Agent, or Firm*—M. Michael Carpenter

[57] ABSTRACT

A tool is shown into which two rows of aligned contacts may be inserted. The contacts are connected at one end to a selvedge strip that may be cut to a given length to include a predetermined number of contacts. An insulator housing mounts upon the tool and around the contacts to form a preassembled connector. The housing also functions as a support and guide for the contacts as they are inserted into apertures in a printed circuit board.

11 Claims, 4 Drawing Figures

METHOD AND APPARATUS FOR PREASSEMBLING A PRINTED CIRCUIT BOARD CONNECTOR

BACKGROUND OF THE INVENTION

The present invention relates to a method for preassembling a printed circuit board connector and apparatus for carrying out that method and, more particularly, to an improved method and apparatus for preassembling a plurality of contacts within an insulator housing upon the apparatus prior to inserting the contacts of the preassembled connector into apertures in a printed circuit board.

It is well known in the prior art to assemble a plurality of contacts into an insulator to form a discrete electrical connector that mounts a printed circuit board upon which an electrical circuit is assembled. Such a board is often referred to as a "daughter board." It is also known to press fit the assembled discrete electrical connector into a plurality of aligned plated-through holes in a second, larger printed circuit board, often referred to as a "mother board." Such an arrangement is taught by U.S. Letters Pat. No. 3,530,422, by D. S. Goodman, which issued Sept. 22, 1970. The inventive idea of the Goodman patent is to construct a discrete connector and its contacts to enable the contacts to support the connector housing as pressure is applied to the housing to press the contacts into apertures in the mother board.

The prior art has moved away from the utilization of discrete circuit board connectors toward the concept of preassembling a connector by first pressing the contacts into the printed circuit board, or mother board, and then placing a housing over the contacts. Such an arrangement is shown in FIGS. 4–7 of U.S. Letters Pat. No. 3,518,610, by D. S. Goodman, et al., which issued June 30, 1970. In Goodman, a few contacts are first inserted into the mother board before a discrete daughter board connector is placed upon the mother board over the first assembled contacts.

The concept of placing all the contacts into a mother board and then placing a housing over the contacts is taught in U.S. Letters Pat. No. 3,659,243, by G. H. Gluntz, which issued Apr. 25, 1972. Here the assembled connector receives an integrated circuit, or IC, which is another form for mounting an electrical circuit. A connector in which all contacts are first inserted into a mother board and a housing capable of mounting a daughter board is then snapped over the contacts is shown in U.S. Letters Pat. No. 3,783,433, by H. N. Kurtz, et al., which issued Jan. 1, 1974, and is assigned to the assignee of the present invention.

To simplify the assembly of the plurality of contacts, it is known to form the contacts from a sheet metal strip leaving one end of the contacts attached to a carry strip, or selvedge strip. The selvedge strip is then cut to accommodate a predetermined number of contacts in an aligned configuration for insertion into the printed circuit board apertures. Such an arrangement is shown in U.S. Letters Pat. No. 2,947,965, by R. R. Scoville, which issued on Aug. 2, 1960. While the Scoville reference teaches the concept of comb-loading contacts, there is no reference made to an insulated housing. The Gluntz patent illustrates the concept of comb-loading a plurality of contacts and then placing a housing over the contacts as aforesaid.

Other prior art patents showing the concept of comb-loading include U.S. Letters Pat. No. 2,995,617, by P. A. Maximoff, et al., and U.S. Letters Pat. No. 3,182,276, by H. E. Ruehlemann. Additional patents showing the concept of press fitting contacts into a printed circuit board and then snapping a housing over the contacts include U.S. Letters Pat. No. 3,671,917, by J. P. Ammon, et al., U.S. Letters Pat. No. 3,676,926, by J. A. Kendall, and U.S. Letters Pat. No. 3,769,679, by J. A. Kendall.

The prior art, represented by the patents cited above, teaches the concept of manufacturing an electrical connector by either manufacturing a discrete, stand alone connector which is then assembled on a circuit board or by press fitting a plurality of contacts into a printed circuit board and then snapping an insulator housing over the contacts. The latter method is basically a two-step manufacturing process.

SUMMARY OF THE INVENTION

The present invention seeks to go one step further by eliminating the second step of snapping an insulated housing over the contacts pressed into a mother board. This invention lends itself to automated equipment wherein an entire mother board may be assembled with hundreds of connectors and housings and thousands of contacts without manual manipulation.

The present invention provides a special tool or apparatus which receives a predetermined number of contacts mounted upon a precut selvedge strip and then locks that strip into position. Alternately, the tool may receive one, two, four or more rows of opposing selvedge-strip mounted contacts. The tool further receives an insulator housing specially designed to fit about the tool and retained contacts. The insulator housing is retained upon the tool by sliding friction. In this configuration, the printed circuit board connector is preassembled upon the apparatus. The housing interacts with the tool to retain the contacts against the tool and support the contacts during assembly into a mother board.

To place the preassembled connector in its working environment, the tool is lowered, placing the contacts into aligned apertures in the mother board. The tool then pushes the contacts into the apertures, retaining the insulator about the contacts. Upon removal of the tool, the selvedge strips are removed. Once placed in its working environment upon the printed circuit board, the pressembled connector may be fully repaired. That is, individual contacts can be removed and replaced without damage to the mother board, due to the unique arrangement of the contact-engaging section shown and claimed in U.S. Letters Pat. No. 4,017,143, by Robert G. Knowles which issued Apr. 12, 1977, and which is assigned to the same assignee as the present invention. Further, the insulator housing itself may be snapped on and off of the contacts without the need for additional tools or damage to the housing.

Through its unique design, the housing functions as a tool for spreading the contacts as it is reassembled upon the contacts after removal. The connector formed by the housing and contacts shown here is further described in copending U.S. Pat. application Ser. No. 793,308, filed May 3, 1977, by Gary W. Schwindt.

Accordingly, it is an object of the present invention to provide an improved method and apparatus for preassembling printed circuit board connectors. Another object is to provide a method and apparatus which lends themselves to full automation of connector assembly.

DESCRIPTION OF THE DRAWINGS

A better understanding of the present invention, its objects and appendant advantages will be obtained by reference to the following specification, when considered in connection with the accompanying drawings, wherein.

DESCRIPTION OF THE PREFERRED EMBODIMENTS

Figure 1:
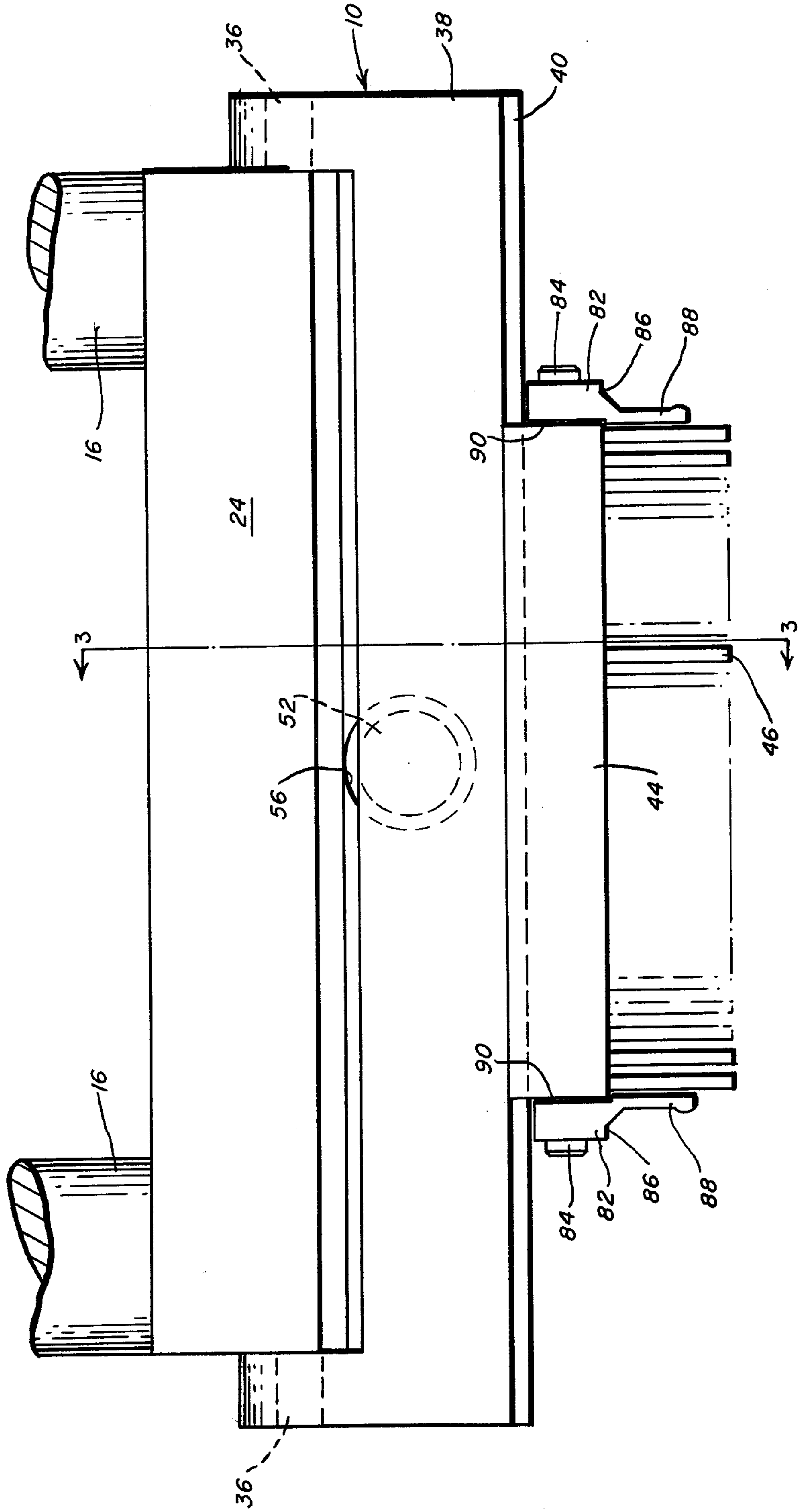
FIG. 1 is a side elevational view showing the apparatus of the present invention.
Figure 4:
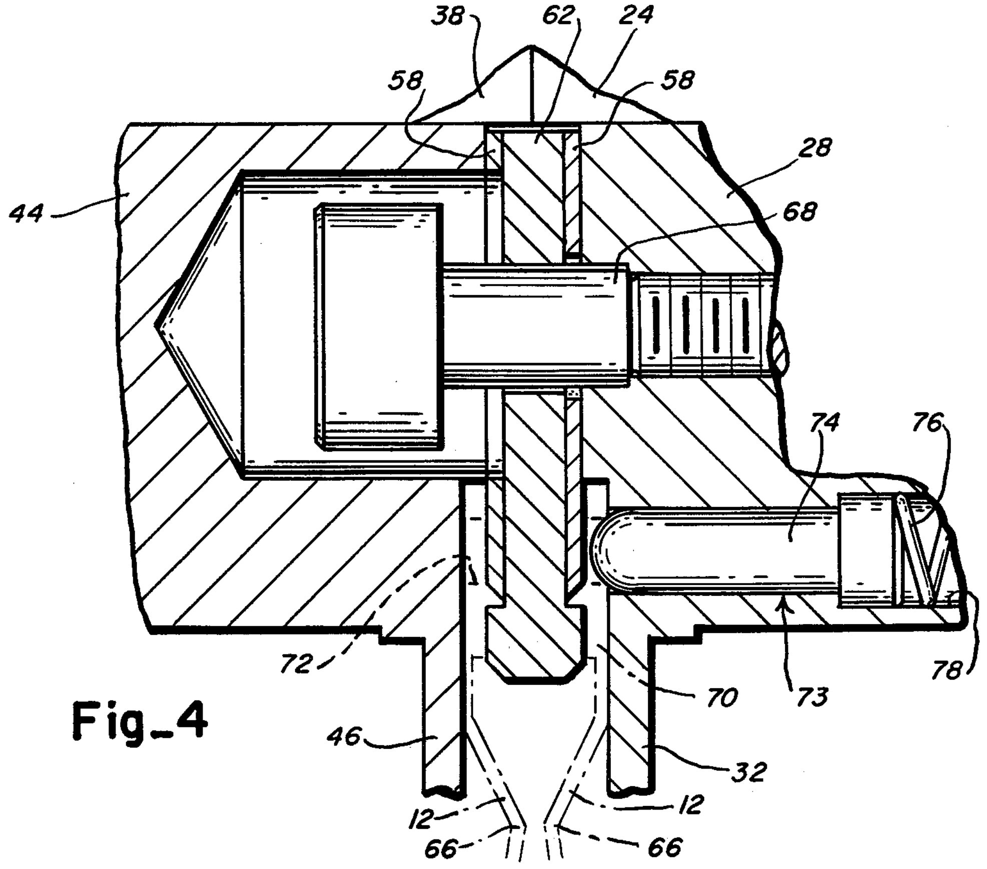
FIG. 4 is a cross-sectional view similar to FIG. 3, showing additional details of the apparatus.

Referring now to the drawings, FIGS. 1 and 4 show a tool 10 which receives contacts 12 and an insulator housing 14. The tool is mounted within a suitable arbor press, not shown, by way of a trifurcated yoke having two lower arms shown at 16. Also mounted to the yoke by way of a third arm 18 is a pneumatic or hydraulic cylinder 20 provided with a piston 22 for supplying linear motion to the tool 10, see FIG. 2. The lower portions of arms 16 are relieved to create shouldered bosses which extend into countersunk apertures in a crossbar 24. The crossbar 24 is configured as a right angle cross section with the lower surface of the downwardly extending leg terminating in a tongue 26 which receives a groove 30 within a connector support member 28.

The connector support member 28 has a plurality of downwardly extending parallel fingers 32 whose lowermost tips engage shoulders 34 on each contact 12. The configuration of the contacts 12 and housing 14 is described in greater detail in a copending patent application by Gary W. Schwindt, mentioned hereinabove.

Attached to each end of the crossbar 24 by a suitable pivotal pin 36 is a U-shaped clamping bar 38 whose lower surface is formed with a tongue 40 which engages a groove 42 in a second connector support member 44. Connector support members 28 and 44 may be attached to the crossbar 24 and the clamping bar 38 by screws 45 shown, for example, in FIG. 3. Fingers 46 extend from the lower inner surface of the support member 44 and, similar to the fingers 32, engage the shoulders 34 on the contacts 12 as the contacts are inserted into the apparatus 10 between the connector support members 28 and 44.

Figure 2:
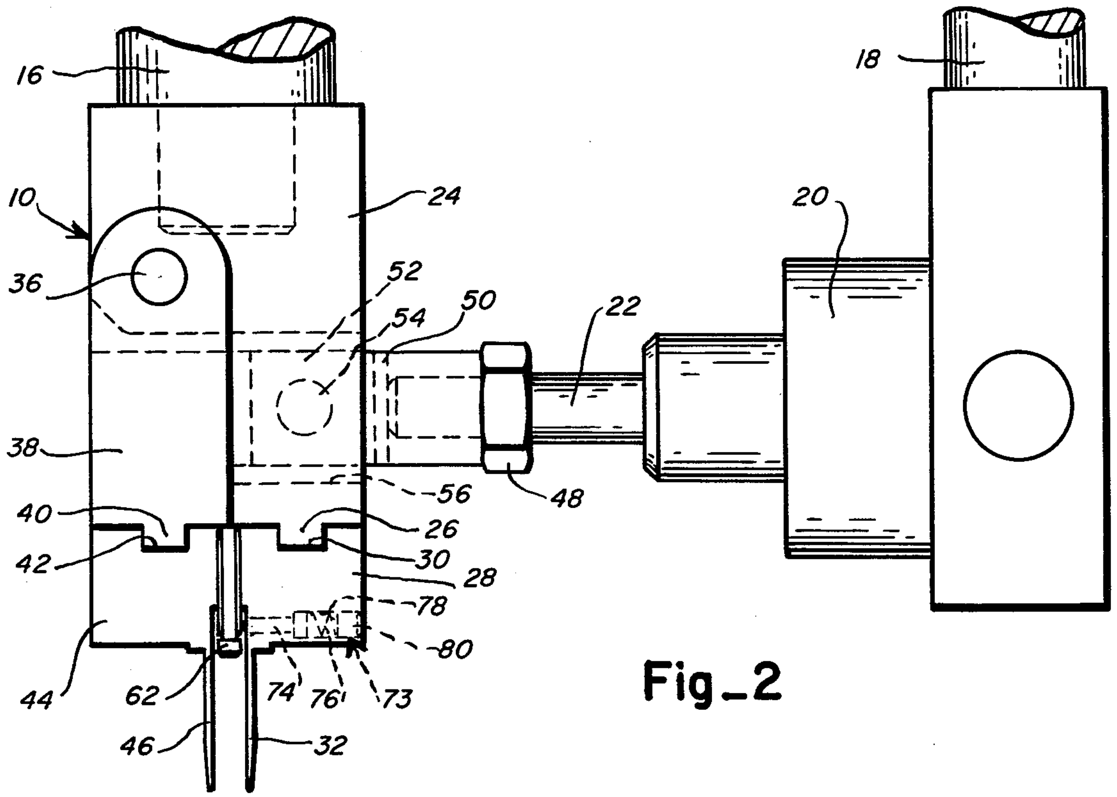
FIG. 2 is an end view of the apparatus shown in FIG. 1.

It will be seen from FIGS. 1 and 2 that the piston 22 from cylinder 20 is provided with a threaded end and a jam nut 48 for securing the piston in a bifurcated pivot post 50. Post 50, in turn, connects to a post 52 having a reduced end that extends between the bifurcation of post 50 and is connected thereto by a pin 54 for supplying linear motion to the U-shaped clamping bar 38 to which post 52 is attached. The lower leg of the right angle crossbar 24 is relieved by a clearance aperture 56 to allow the passage of the posts 50 and 52 therethrough. Application of pressure to cylinder 20 causes the clamping bar 38 to rotate in a counterclockwise direction, as viewed in FIG. 2, about pins 36 for clamping the contacts 12 between connector support members 28 and 44.

Figure 3:
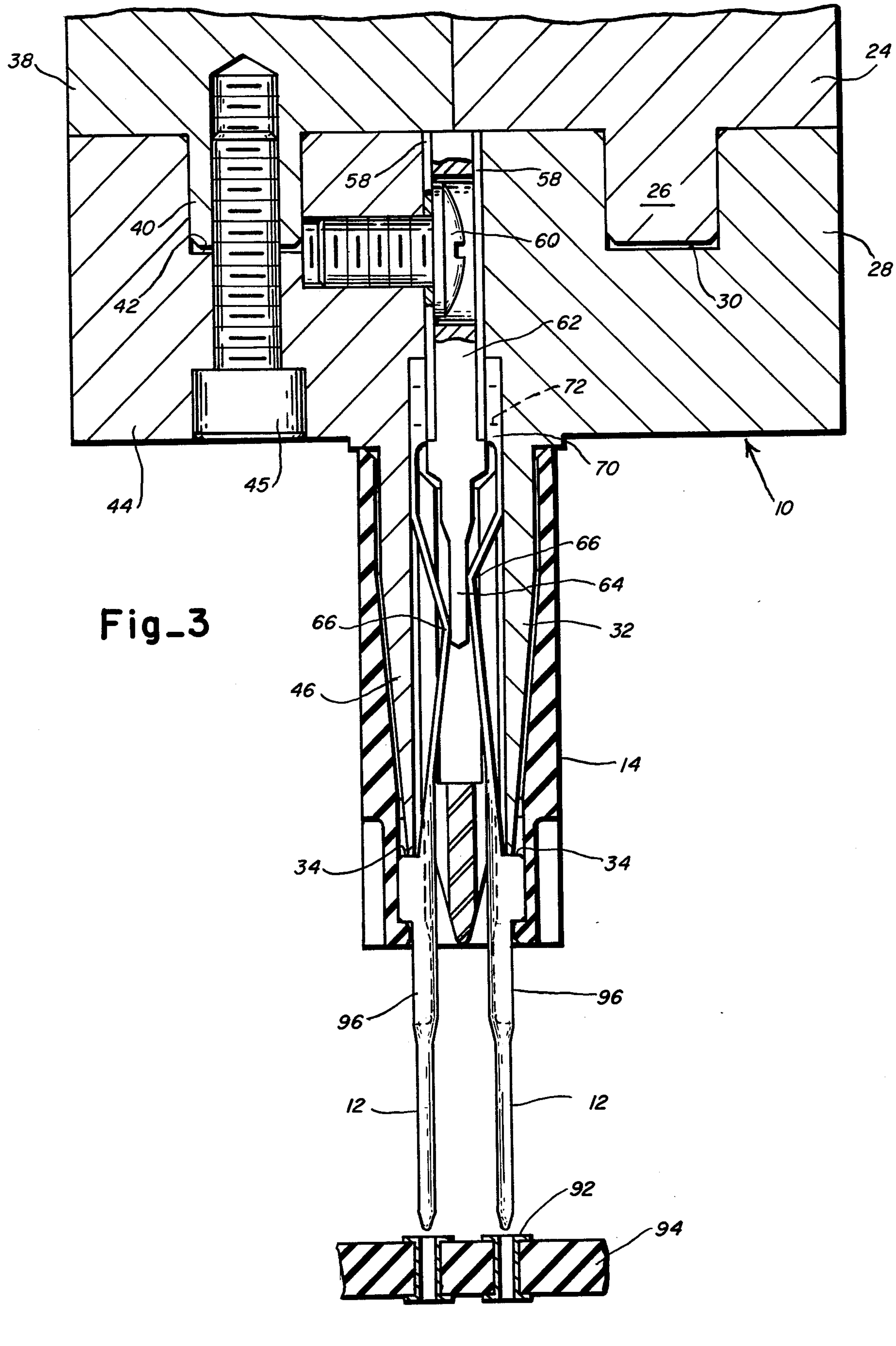
FIG. 3 is a cross-sectional view taken along line 3—3 of FIG. 1, showing the apparatus of the present invention with contacts and housing in preassembled position.

When pressure is removed from the cylinder 20, the clamping bar 38 pivots in a clockwise direction under the urging of a pair of leaf springs 58. Each leaf spring 58 is attached to the inner surface of the connector support members 28 and 44, respectively, by screws 60, best seen in FIG. 3. After the removal of pressure from cylinder 20, the resiliency of the springs 58 forces the connector support members 28 and 44 apart. Located between the springs 58 is a contact mounting blade 62 which, in FIG. 3, is shown with a lower tongue portion 64 extending well into the housing 14. The tongue extension 64 has two sets of shoulders which substantially reduce its crosssectional thickness and enable it to support the contacts 12 which may have varying configurations, such as a knee 66 whose bend is located at various elevations.

In FIG. 4, it will be seen that the tongue 64 may be eliminated if the contacts 12 are to have symmetrical configurations with the knee 66 of each contact occurring at the same elevation. The blade 62 is slideably mounted upon the shoulder of a shouldered screw 68 secured into the connector support member 28. This configuration allows the blade to move away from the inner surfaces of both connector support members 28 and 44 as the pressure within cylinder 20 is relieved to free any portion of the contacts 12 retained therebetween.

The portion of the contacts 12 which fits between the blade 62 and the connector support members 28 and 44 is a selvedge strip 70 having uniformly spaced apertures 72 located above each contact. As seen in FIG. 4, the connector support members 28 and 44 mount a detent subassembly 73, only one of which is shown. The detent subassembly consists of a shouldered pin 74 which is spring loaded by a spring 76 slideably retained in a counterbored hole 78 in each of the connector support members 28 and 44. Each counterbored hole 78 is threaded at its outer end and closed by a suitable set screw 80 mounted therein. As the contacts 12 are inserted between the connector support members 28 and 44 and the blade 62, the detents formed by the shouldered pins 74 engage the apertures 72 in selevedge strip 70 for locating and initially retaining the contacts.

The apparatus 10 of the present invention is arranged to permit either automatic or hand loading. As the connector support members 28 and 44 open under the urging of springs 58, a precut selvedge strip is inserted therebetween. Closure of the support members locks the selvedge strip 20 and contacts 12 attached at one end thereto into place. The lower portions of fingers 32 and 46 engage the upper shoulders 34 on contacts 12, while the inner surfaces of the fingers also support the contacts.

Next, the housing 14 is slid over the contacts 12 and around the fingers 32 and 46. As seen in FIG. 1, a springloaded latching subassembly 82 extends from each end surface of the connector support member 28, where it is mounted as by screws 84. The latching subassembly 82 includes a block 86 having a housing latching figner 88 extending from its forward lowermost surface. The block 86 is separated from the end surface of the connector support member 28 by spring washers 90 which urge the block 86 and its finger 88 in an outward direction.

As the housing 14 is inserted about the contacts 12 and the contact support fingers 32 and 46, the housing depresses the latching fingers 88 which retain the housing in its desired position by sliding friction. In this position, it will be seen that the housing 14 acts in cooperation with the tool 10 and fingers 32 and 46 to further support the contacts 12.

Once properly positioned upon the tool 10, the preassembled contacts 12 and housing 14 are brought into alignment over a printed circuit board or mother board which, for example, is mounted upon movable table (not shown) associated with the tool 10. The table is capable of motion in the X and Y directions, as is well known. When a proper location is established, the tool 10 is lowered, causing the contacts 12 to pass through aligned plated-through holes 92 in an insulated board 94 that forms the mother board. Through the application of pressure on the shoulders 34 by the tips of fingers 32 and 46 and the application of pressure upon the upper surfaces of the selvedge strips 70, the contacts 12 are conveniently urged into the plated-through holes 92. As the tool 10 is lowered, the C-chaped printed circuit board-engaging sections 96 of the contacts 12 are deformed into holes 92 for retaining the contacts in the holes, as described further in the above-referenced U.S. Letters Pat. No. 4,017,143, by Robert G. Knowles.

Once the lower surface of housing 14 has been seated upon the printed circuit board 94, the pressure within cylinder 20 is released and the tool 10 is raised. As the contact support member 44 pivots in a clockwise direction, the selvedge strips 70 are released, leaving the preassembled contacts 12 and housing 14 in its final working environment upon the mother board 94.

After the tool 10 has been raised, the selvedge strips 70 may be removed from the contacts 12 by a simple twisting motion. Alternately, the apparatus 10 can provide the means for twisting the selvedge strips by using a tool similar to that shown in FIG. 4, wherein support members 28 and 44 are provided without fingers 32 and 46. As the modified apparatus is lowered into position, a modified blade 62 engages the inner surfaces of the two selvedge strips. The moving the table underneath the apparatus 10 in a back-and-forth direction, the modified blade 62 engages and twists the selvedge strips sufficiently to cause them to disengage from the contacts. The modified connector mounting members 28 and 44 should be loosely clamped to enable the selvedge strips to twist without deforming the contacts.

Obviously, the method for preassembling the contacts 12 and housing 14 may be modified in other ways, as can the apparatus 10 described hereinabove.

The embodiments of the invention in which an exclusive property or privilege is claimed are defined as follows:

1. A method for preassembling an electrical connector for mounting upon a printed circuit board, comprising the steps of:

loading a plurality of contacts into a preassembly tool to form at least one row of aligned contacts;

placing an insulator housing upon said preassembly tool about said plurality of aligned contacts to preassemble said connector; and pushing said preassembly tool down against said printed circuit board for placing the said preassembled connector upon said board by inserting said aligned contacts into apertures in said board wherein said contacts hold said insulator housing against said board.

2. A method for preassembling an electrical connector as claimed in claim 1, including the additional steps of:

cutting selvedge strips that support a predetermined number of said contacts to desired lengths; and loading at least two precut selvedge strips supporting said contacts into said preassembly tool to form facing rows of contacts.

3. A method for preassembling an electrical connector as claimed in claim 2, including the further steps of:

pulling said preassembly tool up from said printed circuit board to release said preassembled connector; and removing said selvedge strips from said contacts.

4. A method for preassembling an electrical connector for mounting upon a printed circuit board, comprising the steps of:

cutting a selvedge strip supporting a plurality of parallel contacts from one end thereof to a desired length;

loading said precut length of selvedge strip-supported contacts into a preassembly tool;

cutting a second length of a selvedge strip supporting a like number of parallel contacts;

loading said second length of selvedge strip-supported contacts into said preassembly tool;

placing an insulator housing upon said preassembly tool about said loaded first and second rows of contacts to preassemble said connector;

aligning said printed circuit board under said preassembled connector having at least two rows or apertures therein corresponding in number to and aligned with said first and second rows of loaded contacts;

pushing said preassembly tool and said preassembled connector therein against said printed circuit board for securing said contacts within said apertures in said board and said housing thereon;

removing said preassembly tool; and removing said selvedge strips from said first and second rows of contacts, thereby leaving said preassembled connector in place upon said printed circuit board.

5. Apparatus for preassembling an electrical connector for mounting upon a printed circuit board having apertures therein, comprising:

means for retaining a plurality of contacts in at least one aligned row;

means for retaining an insulator housing in a preassembled connector configuration about said row of aligned contacts on said means for retaining said contacts; and means for inserting said contacts in said preassembled connector into at least one aligned row of said apertures in said printed circuit board for completing the assembly of said pressembled connector.

6. Apparatus for preassembling an electrical connector for mounting upon a printed circuit board, as claimed in claim 5, wherein said means for retaining a plurality of contacts include:

a contact mounting blade;

a pair of connector support members on each side of said contact mounting blade for receiving and clamping said contacts therebetween; and contact support fingers extending from each contact support member for engaging and supporting each of said plurality of contacts.

7. Apparatus for preassembling an electrical connector for mounting upon a printed circuit board, as claimed in claim 6, wherein said means for retaining an insulator housing include:

latch assembly means located at each end of the one of said pair of connector support members;

a housing support finger extending from each latch assembly means for engaging and mounting said insulator housing in a preassembled configuration about said contacts; and said housing arranged to retain said contacts against said contact support fingers.

8. Apparatus for preassembling a printed circuit board connector and mounting said connector upon a printed circuit board having apertures therein, comprising:

clamping support members for receiving a selvedge strip between said members, said selvedge strip mounting a predetermined number of contacts in an aligned, evenly spaced row;

contact support fingers extending from each clamping member for engaging the outer surface of each of said contacts to support said contacts;

latching means mounted in juxtaposition with said clamping members for receiving and retaining an insulator housing as it is preassembled about said predetermined number of contacts;

said insulator housing engaging the inner surface of each of said contacts to support said contacts against said contact support fingers, thus forming part of said apparatus; and means for inserting said preassembled contacts and insulator housing into said printed circuit board having a predetermined number of apertures therein for receiving said contacts, wherein the insertion of said contacts and removal of said apparatus completes the assembly of said connector.

9. Apparatus for preassembling a printed circuit board connector as claimed in claim 8, additionally comprising:

means for removing said selvedge strip from said contacts after the insertion thereof.

10. Apparatus for preassembling a printed circuit board connector as claimed in claim 8, additionally comprising:

contact mounting blade means mounted between said clamping members for receiving between said blade means and said clamping members at least two selvedge strips mounting said contacts;

means for opening and closing said clamping members; and spring means mounted between said clamping members and said blade means to urge said blade means away from said clamping member as said clamping members are opened.

11. Apparatus for preassembling a printed circuit board connector as claimed in claim 10, additionally comprising:

said selvedge strips having apertures therein; and detent means mounted in said clamping members for urging said selvedge strips against said blade means and for locating said selvedge strips between said blade means and said clamping members.

* * * * *